(12) United States Patent
Toshima et al.

(10) Patent No.: US 6,688,020 B2
(45) Date of Patent: Feb. 10, 2004

(54) SUBSTRATE PROCESSING APPARATUS

(75) Inventors: Takayuki Toshima, Shizuoka-ken (JP); Tadashi Iino, Shizuoka-ken (JP)

(73) Assignee: Tokyo Electron Limited, Tokyo (JP)

( * ) Notice: Subject to any disclaimer, the term of this patent is extended or adjusted under 35 U.S.C. 154(b) by 131 days.

(21) Appl. No.: 09/839,430

(22) Filed: Apr. 20, 2001

(65) Prior Publication Data
US 2001/0032396 A1 Oct. 25, 2001

(30) Foreign Application Priority Data
Apr. 21, 2000 (JP) ........................................ 2000-120842

(51) Int. Cl.⁷ ................................................. F26B 13/10
(52) U.S. Cl. ............................. 34/573; 34/558; 34/567; 34/572
(58) Field of Search .......................... 34/558, 565, 567, 34/572, 573

(56) References Cited

U.S. PATENT DOCUMENTS

| | | | |
|---|---|---|---|
| 6,017,414 A | * 1/2000 | Koemtzopoulos et al. .. | 156/345 |
| 6,167,323 A | * 12/2000 | Komino et al. ............ | 700/121 |
| 6,366,346 B1 | * 4/2002 | Nowak et al. ............. | 356/72 |
| 6,437,290 B1 | * 8/2002 | Shao et al. ................. | 219/390 |
| 6,442,736 B1 | * 8/2002 | Girard et al. .............. | 716/4 |

FOREIGN PATENT DOCUMENTS

JP 11-33448 8/1999

* cited by examiner

Primary Examiner—Pamela Wilson
(74) Attorney, Agent, or Firm—Morrison & Foerster LLP

(57) ABSTRACT

A substrate processing apparatus and method which can prevent accidents in advance so as to ensure safety against interruption of operations of the apparatus and leakage of processing substances. In a substrate processing method in which wafers W are processed are processed by feeding an ozone gas 5 to the wafers W loaded in a processing vessel 2 while an interior atmosphere in the processing vessel is being exhausted to be passed through an ozone killer 10, the ozone gas 5 is fed under the conditions that the processing vessel 2 is tightly closed, and the ozone killer in its normal state. When the processing is interrupted, an interior atmosphere in the processing vessel 2 is forcedly exhausted. When the gas leaks, the interior atmosphere and a peripheral atmosphere of the processing vessel 2 are forcedly exhausted while the feed of the ozone gas 5 is paused. The processing gas is fed under a condition that the processing vessel is tightly closed, and the post-treatment of the exhausted interior atmosphere is normally carried out.

9 Claims, 11 Drawing Sheets

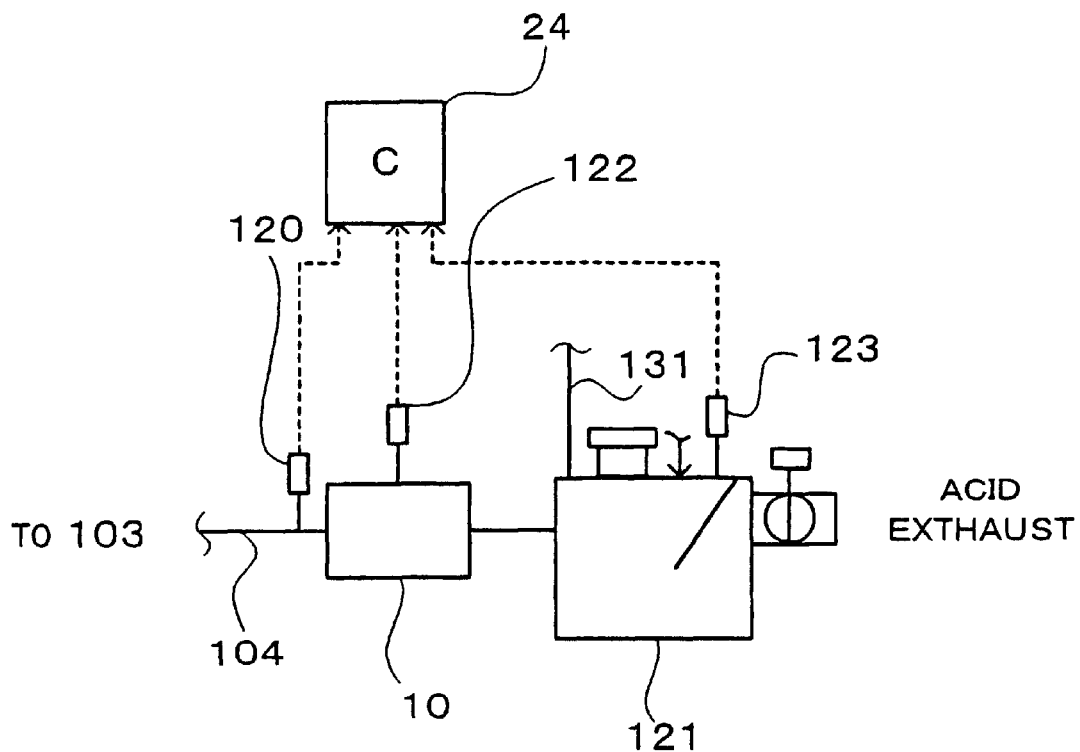
F I G. 9
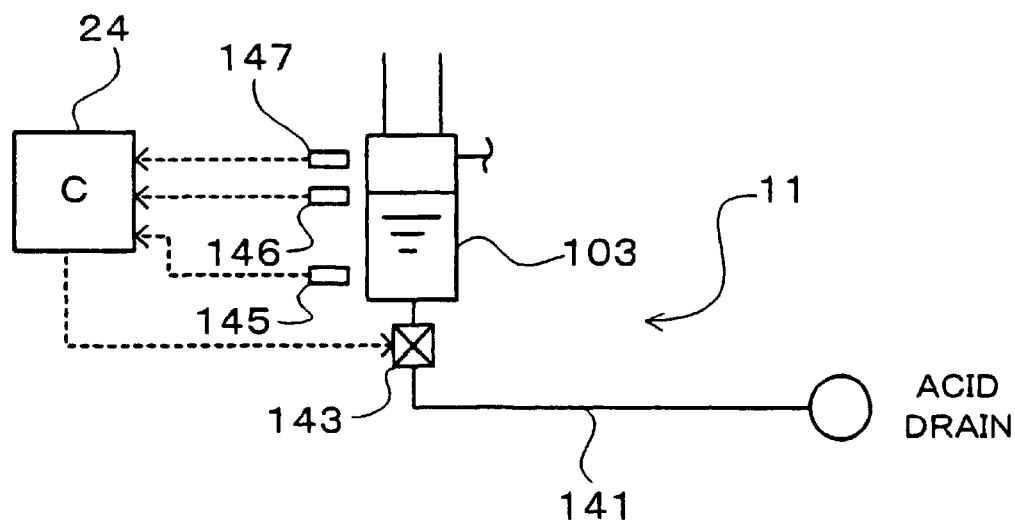
F I G. 10

SUBSTRATE PROCESSING APPARATUS

CROSS REFERENCE TO RELATED APPLICATIONS

The subject application is related to subject matter disclosed in Japanese Patent Application No. 2000-12-842 filed on Apr. 21, 2000 in Japan to which the subject application claims priority under Paris Convention and which is incorporated herein by reference.

BACKGROUND OF THE INVENTION

1. Field of the Invention

The present invention relates to a substrate processing method and substrate processing apparatus for processing substrates.

2. Related Background Art

In photolithography processing for, e.g., a semiconductor wafer (hereinafter called "a wafer"), a resist is applied to the wafer, and a pattern is exposed and developed. Then, the resist is removed from the wafer.

A cleaning equipment is used in such removal of the resist. In the conventional cleaning equipment, a wafer is immersed in a cleaning tank loaded with a chemical liquid which is called SMP (a mixed liquid of $H_2SO_4/H_2O_2$) to release the resist. On the other hand, recently it is required from the ecological viewpoint that the resist is removed by using a solution with ozone ($O_3$) solved in, which is easy to waste. In such cleaning, the so-called dip-type, in which a wafer is immersed in a cleaning tank loaded with a solution with ozone solved in, is used to oxidize the resist with oxygen radicals in the solution to decompose the resist to carbon dioxide, water, etc.

The solution is produced by bubbling a high concentration of ozone gas into pure water to solve the ozone in the pure water, and the thus produced solution is loaded in a cleaning tank. Meanwhile the ozone in the solution is decomposed to decrease the ozone concentration of the solution, which often makes it impossible to sufficiently remove the resist. Furthermore, with a wafer immersed in the solution, while the ozone is reacting with the resist and is continuously being decomposed, ozone supply to the resist surface is insufficient, which makes a reaction rate low.

Then, a cleaning equipment in which ozone gas and steam are used to utilize ozone for the processing for removing a resist from a wafer is anew proposed in place of the cleaning equipment of the dip-type, in which a wafer is immersed in the solution. In such cleaning equipment, ozone gas is applied to wafers loaded in a tightly closed processing vessel. For processing using ozone, which is a harmful substance to the human body, etc., it is required that various accident preventive means and safety means are used.

Thus, an object of the present invention is to provide a substrate processing method and a substrate processing apparatus which can prevent accidents in advance, specifically, can ensure safety even if the apparatus should be instantaneously stopped due to power failures or others, or processing gas leakage should take place.

SUMMARY OF THE INVENTION

An object of the present invention is to provide a substrate processing method and a substrate processing apparatus which can prevent accidents in advance, specifically, can ensure safety even if the apparatus should be instantaneously stopped due to power failures or others, or processing gas leakage should take place.

To solve the above-described problems, a first invention of the present application provides a substrate processing method in which a substrate is processed by feeding a processing gas to the substrate loaded in a processing vessel while an interior atmosphere in the processing vessel is being exhausted to be subjected to a post-treatment, the processing gas being fed under a condition that the processing vessel is tightly closed, and the post-treatment of the exhausted interior atmosphere is normally carried out.

In a first substrate processing method according to the present invention, ozone gas, for example, is suitably used as the processing gas. According to the first substrate processing method of the present invention, the processing gas is fed to substrates loaded in the tightly closed vessel, and the substrates are suitably processed in the processing vessel by using the processing gas. On the other hand, an interior atmosphere in the processing vessel is exhausted to thereby exhaust the processing gas out of the processing vessel. The exhausted processing gas is post-treated. In the post-treatment, when a processing gas, e.g., ozone gas, contains a substance (ozone) which is harmful to the human body, the harmful substance is removed, making the processing gas harmless to be exhausted for safety to, e.g., an exhaust system of a plant. A processing gas can be, other than ozone gas, e.g., chlorine gas, fluoride gas, hydrogen gas, chlorine gas, fluoride gas, hydrogen gas, etc. containing various radicals in advance.

Here, when a processing gas is fed before the processing vessel is tightly closed, the processing gas disperses around. When the post-treatment is abnormal, there is a risk that the processing gas may be discharged as it is to an exhaust system of a plant. However, according to the present invention, the processing gas is fed under conditions that the processing vessel is tightly closed, and that the exhausted interior atmosphere is normally post-treated, and unless both conditions are satisfied, the processing gas is not fed, whereby the dispersion and the untreated drain of the processing gas can be prevented. Especially in a case that the processing gas contains ozone gas, which is harmful, accidents to the human body due to, e.g., the harmful substance can be precluded.

In a second substrate processing method according to the present invention, it is possible that when the processing of the substrate is interrupted, the interior atmosphere of the processing vessel is forcedly exhausted. When the processing is interrupted by, e.g., a power failure, an earthquake or others, the interior atmosphere in the processing vessel is forcedly exhausted to expel the processing gas from the interior of the processing vessel. Then, when the processing is resumed, often operators of the plant, for example, open the processing vessel to check interior states of the processing vessel. If the processing vessel is opened with the processing gas remaining therein, the processing gas may disperse. However, the thus forced-exhaust of the processing gas can prevent such dispersion of the processing gas. Especially when the processing gas is ozone gas, the forced exhaust of the processing gas can prevent such accident for safety.

In a third substrate processing method according to the present invention, it is possible that when the processing gas leaks around the processing vessel, the interior atmosphere of the processing vessel is forcedly exhausted while the feed of the processing gas is paused. According to the third substrate processing method, when the gas leakage has occurred, immediately the interior atmosphere is forcedly exhausted while the feed of the processing gas is stopped, whereby no more gas leakage can occur, and the damage can be minimized.

A fourth substrate processing method according to the present invention which a substrate is processed by feeding a processing gas to the substrate loaded in a processing vessel while an interior atmosphere in the processing vessel is being exhausted to be post-treated, when the processing gas leaks around the processing vessel, the interior atmosphere of the processing vessel is forcedly exhausted while the feed of the processing gas is paused.

According to the fourth substrate processing method of the present invention, as in the first substrate processing method, ozone gas, for example, can be suitably used as the processing gas. In the fourth substrate processing method according to the present invention, as in the first substrate processing method, the processing gas is fed into the processing vessel, and the substrates are suitably processed. On the other hand, the processing gas is exhausted out of the processing vessel, then is post-treated to be made harmless to be exhausted for safety to, e.g., an exhaust system of a plant. Here, when the processing gas leaks through, e.g., a gap of the processing vessel, at the time of the gas leakage, immediately the interior atmosphere is forcedly exhausted while the feed of the processing gas is paused. Then, the processing gas is prevented from leaking from the processing vessel. Thus, the leakage of the processing gas can be minimized for safety.

According to a fifth substrate processing method of the present invention, it is preferable that in the fourth substrate processing method, the processing gas leaks around the processing vessel, the peripheral atmosphere of the processing vessel is exhausted, and the exhausted processing gas is post-treated. Thus, even when the processing gas leaks around the processing vessel, the peripheral processing gas is made harmless to be exhausted for safety to, e.g., an exhaust system of a plant.

According to a sixth substrate processing method of the present invention, it is possible that when the processing gas leaks, the peripheral atmosphere of the processing vessel is forcedly exhausted. Thus, the processing gas is prevented without failure from dispersing beyond the periphery of the processing vessel in a large area. Accordingly, even when the processing gas leaks, safely no accident occurs.

According to a seventh substrate processing method of the present invention, it is preferable that the interior of the processing vessel is opened after a concentration of the processing gas in the processing vessel has been detected, and it has been confirmed that a detected processing gas concentration is below a prescribed value. A prescribed value is set to be a concentration which is harmless to the human body, etc. The processing vessel is opened after safety is thus confirmed, whereby accident can be precluded.

According to an eighth substrate processing method of the present invention, it is possible that the interior of the processing vessel is opened by pausing the feed of the processing gas, and then exhausting the interior atmosphere of the processing vessel for at least a prescribed period of time. In the eighth substrate processing method, the interior atmosphere in the processing vessel is exhausted for a prescribed period of time, whereby a processing gas concentration in the processing vessel can be below a prescribed value. Thus, accidents can be precluded for safety.

According to a ninth substrate processing method of the present invention, it is preferable that when the feed of the processing gas is paused, and the interior atmosphere of the processing vessel is exhausted, a negative pressure atmosphere is established in the processing vessel. A positive pressure atmosphere is established in the processing vessel when the interior atmosphere is exhausted, there is a risk that the processing gas may leak around. However, in the ninth substrate processing method, a negative pressure atmosphere is established in the processing vessel, whereby the leakage of the processing gas can be prevented.

According to a tenth substrate processing method of the present invention, when post-treatment is not carried out normally, the interior atmosphere of the processing vessel is forcedly exhausted while the feed of the processing gas is paused.

A first substrate processing apparatus according to the present invention in which a processing gas is fed by processing gas supply nozzle to a substrate loaded in a processing vessel while an interior atmosphere of the processing vessel is being exhausted through an interior atmosphere exhaust pipe line to be post-treated by a post-treatment mechanism, the apparatus comprising an opening/closing member for opening/closing a load/unload opening of the processing vessel; and controller for controlling feed of the processing gas by the processing gas supply nozzle, based on a detected signal outputted by opening/closure detector for detecting opening/closure of the opening/closing member, and a detected signal outputted by operation detector for detecting an operational state of the post-treatment-mechanism.

In the first substrate processing apparatus of the present invention, the processing gas is suitably, e.g., ozone gas or others. According to the first substrate processing apparatus, the opening/closure member is opened to load substrates into the processing vessel, and then the opening/closure member is closed to tightly close the processing vessel. Then, the processing gas is fed into the processing vessel by the processing gas supply nozzle to suitably process the substrate. On the other hand, the interior atmosphere in the processing vessel is exhausted through the interior atmosphere exhaust pipe line to thereby exhaust the processing gas out of the interior of the processing vessel. The exhausted processing gas is post-treated by the post-treatment mechanism. In a case of, e.g., ozone gas containing ozone, which is harmful to the human body, the post-treatment mechanism uses a mechanism, such as the ozone killer, which removes a harmful substance (ozone). Then, in the post-treatment, the harmful substance is removed to make the processing gas harmless enough to be safely exhausted to, e.g., an exhaust system of a plant.

The controller permits the processing gas supply nozzle to feed the processing gas when the controller confirms that the opening/closure member is closed, based on a detected signal outputted by the opening/closure detector, and judges that the post-treatment mechanism is normally operable, based on a detected signal outputted by the operation detector. When the opening/closure member is opened, or the post-treatment mechanism is abnormal, the controller interrupts the supply of the processing gas by the processing gas supply nozzle, Thus, the first substrate processing apparatus of the present invention can preferably carry out the first substrate processing method of the present invention.

According to a second substrate processing apparatus of the present invention, it is preferable that in the first substrate processing apparatus of the present invention, the interior atmosphere exhaust pipe line comprises an ejector for forcedly exhausting the interior atmosphere of the processing vessel. In the second substrate processing apparatus, the ejector forcedly exhausts the interior atmosphere when, for example, the processing of the substrates is interrupted. Thus, the second substrate processing apparatus of the present invention can preferably carry out the second substrate processing method of the present invention.

According to a third substrate processing apparatus of the present invention, it is preferable that there are provided peripheral concentration sensor for detecting a processing gas concentration in a peripheral atmosphere of the processing vessel; a second ejector for forcedly exhausting the peripheral atmosphere of the processing vessel; and controller for controlling, based on a detected signal outputted by the peripheral concentration sensor, the forced exhaust by the ejector for forcedly exhausting the interior atmosphere of the processing vessel and the feed of the processing gas by the processing gas supply nozzle. In the third substrate processing apparatus, the controller operates the ejector and interrupts the supply of the processing gas by the processing gas supply nozzle when the controller detects leakage of the processing gas into the peripheral atmosphere of the processing vessel. Thus, the third substrate processing apparatus of the present invention can preferably carry out the third substrate processing method of the present invention.

According to a fourth substrate processing apparatus of the present invention, it is possible that there is provided controller for controlling the forced exhaust of the peripheral atmosphere by the second ejector, based on a detected signal outputted by the peripheral concentration sensor. In the fourth substrate processing apparatus, the controller operates the ejector when the controller detects leakage of the processing gas into the peripheral atmosphere of the processing vessel. Thus, the fourth substrate processing apparatus of the present invention can preferably carry out the sixth substrate processing method of the present invention.

A fifth substrate processing apparatus of the present invention in which a processing gas is fed by processing gas supply nozzle to a substrate loaded in a processing vessel while an interior atmosphere of the processing vessel is being exhausted through an interior atmosphere exhaust pipe line to be post-treated by a post-treatment mechanism, the apparatus comprising an opening/closing member for opening/closing a load/unload opening of the processing vessel; peripheral concentration sensor for detecting a processing gas concentration in the peripheral atmosphere of the processing vessel; a peripheral exhaust pipe line connected to a case for exhausting the peripheral atmosphere of the processing vessel; and controller for controlling, based on a detected signal outputted by the peripheral concentration sensor, the exhaust by the interior atmosphere exhaust pipe line and the feed of the processing gas by the processing gas supply nozzle.

In the fifth substrate processing apparatus of the present invention, as in the first substrate processing apparatus of the present invention, ozone gas, for example, is suitably used as the processing gas. According to the fifth substrate processing apparatus, as in the first substrate processing apparatus of the present invention, substrates are loaded in the processing vessel, and then the processing gas is fed into the processing vessel by the processing gas supply nozzle to suitably process the substrates. On the other hand, the processing gas is exhausted out of the processing vessel through the interior atmosphere exhaust pipe line. The exhausted processing gas is post-treated by the post-treatment mechanism and makes the exhaust processing gas harmless to be exhausted for safety to, e.g., an exhaust system of a plant. Here, when the controller detects, based on a detected signal, leakage of the processing gas into the peripheral atmosphere of the processing vessel, the controller enhances, if necessary, the operation of the interior atmosphere exhaust pipe line to thereby increase an exhaust rate of the interior atmosphere while interrupting the supply of the processing gas by the processing gas supply nozzle. Thus, the fifth substrate processing apparatus of the present invention can preferably carry out the fourth substrate processing method of the present invention.

In a sixth substrate processing apparatus of the present invention, when the concentration sensor has an abnormality, the controller pauses the feed of the processing gas while controlling the ejector to operate.

In a seventh substrate processing apparatus of the present invention, it is preferable that in the fifth substrate processing apparatus of the present invention, comprising controller for controlling the exhaust by the peripheral exhaust pipe line and the case, based on a detected signal outputted by the peripheral concentration sensor. Thus, the seventh substrate processing apparatus of the present invention can preferably carry out the sixth substrate processing method of the present invention.

According to a eighth substrate processing apparatus of the present invention, it is preferable that there are provided interior concentration sensor for detecting a processing gas concentration in the processing vessel; and controller for controlling the opening/closure of the opening/closing member, based on a detected signal outputted by the interior concentration sensor. In the eighth substrate processing apparatus, when the controller judges, after the supply of the processing gas is stopped, that a processing gas concentration in the processing vessel is below a prescribed value which is harmless to the human body, etc., based on a detected signal outputted by the interior concentration detector, the controller opens the opening/closure member. Thus, the eighth substrate processing apparatus of the present invention can preferably carry out the seventh substrate processing method of the present invention.

According to an ninth substrate processing apparatus of the present invention, it is possible that there is provided air supply nozzle for feeding air in the processing vessel. In the eighth substrate processing apparatus, when the interior atmosphere of the processing vessel is exhausted, air is fed by the air supply nozzle to thereby extrude the processing gas out of the processing vessel. An air supply rate is set to be lower than an exhaust rate of the interior atmosphere. When air is fed at a higher supply rate than an exhaust rate for the interior atmosphere, a positive pressure atmosphere is established in the processing vessel. In a positive pressure atmosphere, there is a risk that the processing gas may leak out of the processing vessel. An air supply rate is made thus lower, whereby the interior of the processing vessel is maintained in a negative pressure atmosphere to thereby prevent leakage of the processing gas and also realize quicker exhaust.

BRIEF DESCRIPTION OF THE DRAWINGS

FIG. 9 is an enlarged view of the second interior exhaust circuit.

FIG. 10 is an enlarged view of a mist trap and the second drain circuit.

DESCRIPTION OF THE PREFERRED EMBODIMENTS

Figure 1:
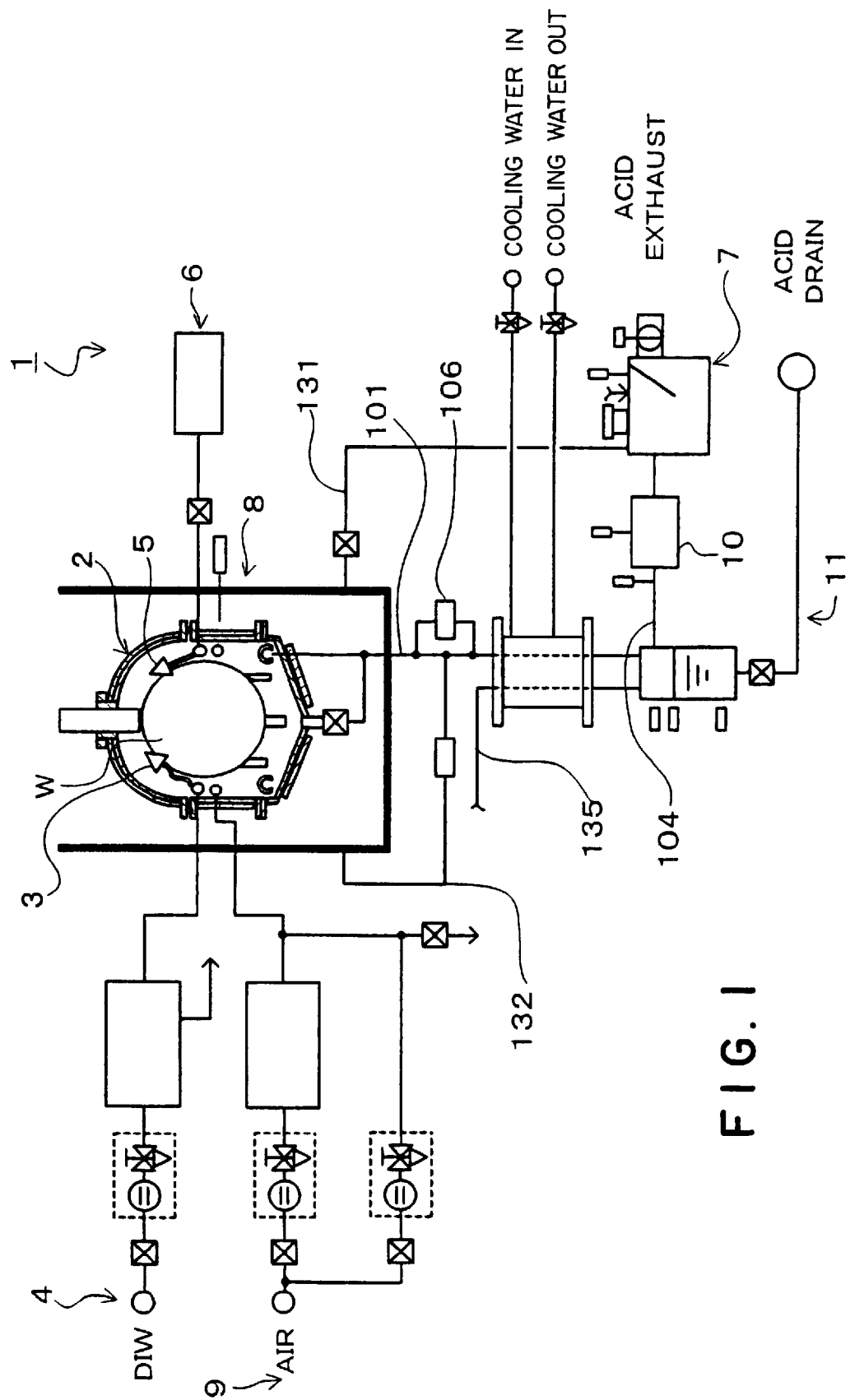
FIG. 1 is a pipe line diagram of a cleaning equipment of one embodiment of the present invention.

A preferred embodiment of the present invention will be explained with reference to the attached drawings and by means of, e.g., a cleaning equipment for cleaning 50 sheets of wafers in one batch. The cleaning equipment uses ozone gas to remove the resist from wafers W. FIG. 1 is an explanatory view of a piping system of the cleaning equipment 1 according to the embodiment of the present invention.

As shown in FIG. 1, the cleaning equipment 1 comprises a processing vessel 2 in which wafers W are processed, steam supply means 4 which feeds steam 3 into the processing vessel 2, ozone gas supply means 6 as processing gas supply means (e.g., processing gas supply nozzle) which feed ozone gas 5 into the processing vessel 2, interior atmosphere exhaust means (e.g., interior atmosphere exhaust pipe line) 7 which exhausts an interior atmosphere in the processing vessel 2, peripheral exhaust means (e.g., a peripheral exhaust pipe line connected to a case) 8 which exhausts a peripheral atmosphere of the processing vessel 2, air supply means (e.g., air supply nozzle) 9 which feeds hot air and room temperature (of the same temperature as, e.g., interior atmosphere temperature) into the processing vessel 2, an ozone killer 10 as a pretreatment mechanism, which removes ozone ($O_3$) of the interior atmosphere exhausted out of the processing vessel 2, and drain means 11 which drains liquid drops in the processing vessel 2.

Figure 2:
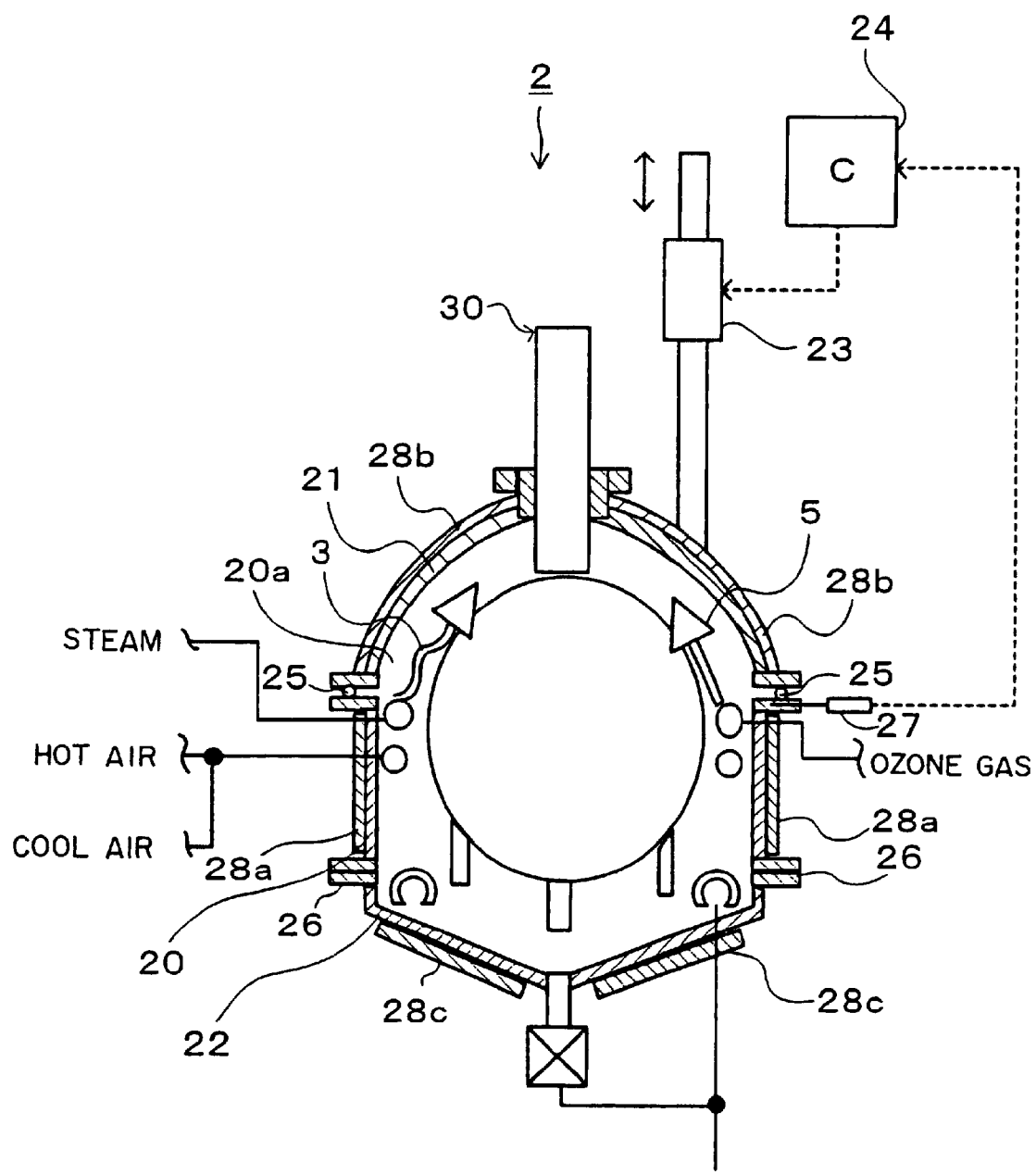
FIG. 2 is an enlarged sectional view of a processing vessel.

As shown in FIG. 2, the processing vessel 2 is roughly divided in a vessel body 20 of a size which is sufficient to accommodate 50 sheets of wafers, a vessel cover 21 as a closure member which opens and closes a loading port 20a formed in the upper side of the vessel body 20, and a vessel bottom 23 which closes a bottom opening of the vessel body 20.

Figure 3:
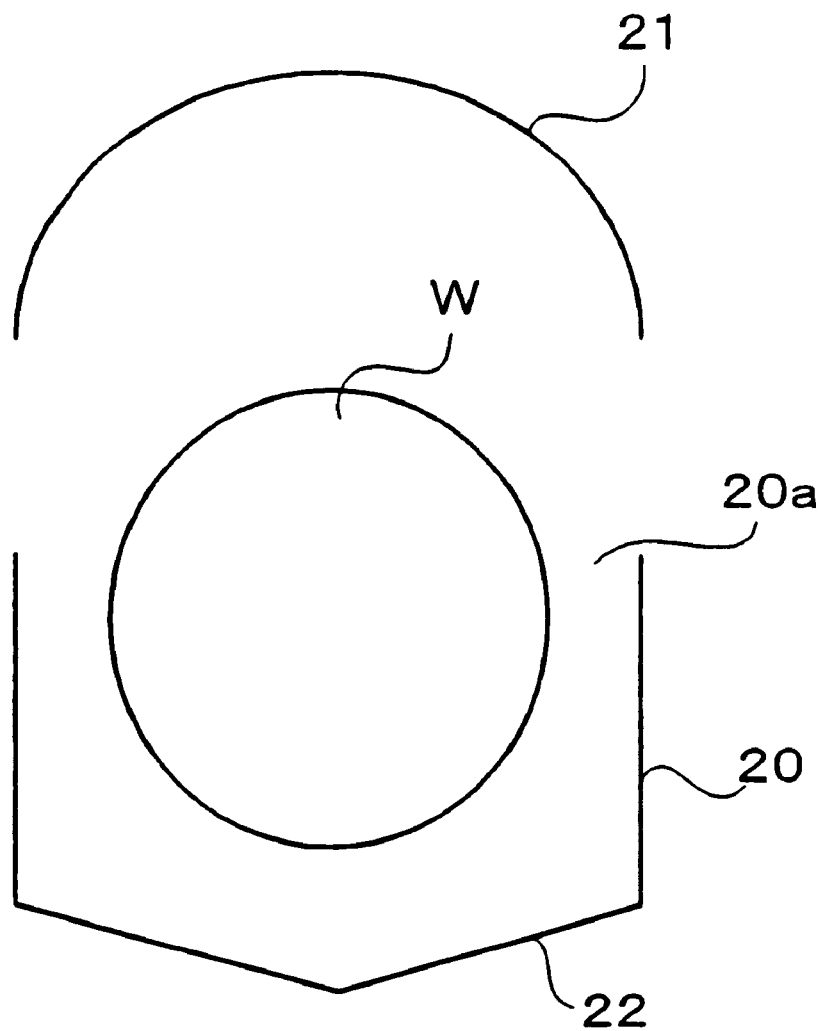
FIG. 3 is an explanatory view of the processing vessel with the vessel cover opened.

The vessel cover 21 is formed in, e.g., a hemisphere and can be moved up and down by a lift mechanism 23. The lift mechanism 23 is connected to a controller 24 as control means. Operations of the lift mechanism 23 are controlled by operation signals outputted by the controller 24. As shown in FIG. 3, when the vessel cover 21 is up, the loading port 20a is opened to permit the wafers to be loaded into the vessel body 20. When the vessel cover 20 is lowered after the wafers W have been loaded in the vessel body 20, as shown in FIG. 2, the loading port 20a is closed. A gap between the vessel body 20 and the vessel cover 21 is tightly closed by a lip O-ring 25. A gap between the vessel body 20 and the vessel bottom 22 is tightly closed by a gasket 26. Thus, a tightly-closed atmosphere is established inside the processing vessel 2 without gas leakage.

A weight sensor 27 as opening/closing detecting means (e.g., opening/closing detector) which detect opening and closure of the vessel cover 21 is provided on the upper end of the vessel body 2. The weight sensor 27 detects a load to the upper end of the vessel body 20 when the vessel cover 21 is closed, blocking the loading port 20a. The controller 24 confirms opening and closure of the vessel cover 21, based on a detected signal inputted by the weight sensor 27. For example, when the weight sensor 27 detects a prescribed load, the controller 24 recognizes a state that the vessel cover 21 is tightly closed.

A rubber heater 28a is mounted on the outer peripheral surface of the vessel body 20, a rubber heater 28b is mounted on the outer peripheral surface of the vessel cover 21, and a rubber heater 28c is mounted on the peripheral surface of the vessel bottom 22. The rubber heaters 28a–28c are heated by power supply from an electric power supply unit (not shown) to heat an interior atmosphere of the processing vessel 2 up to a prescribed temperature (in a range of e.g., 80–120° C.).

Figure 4:
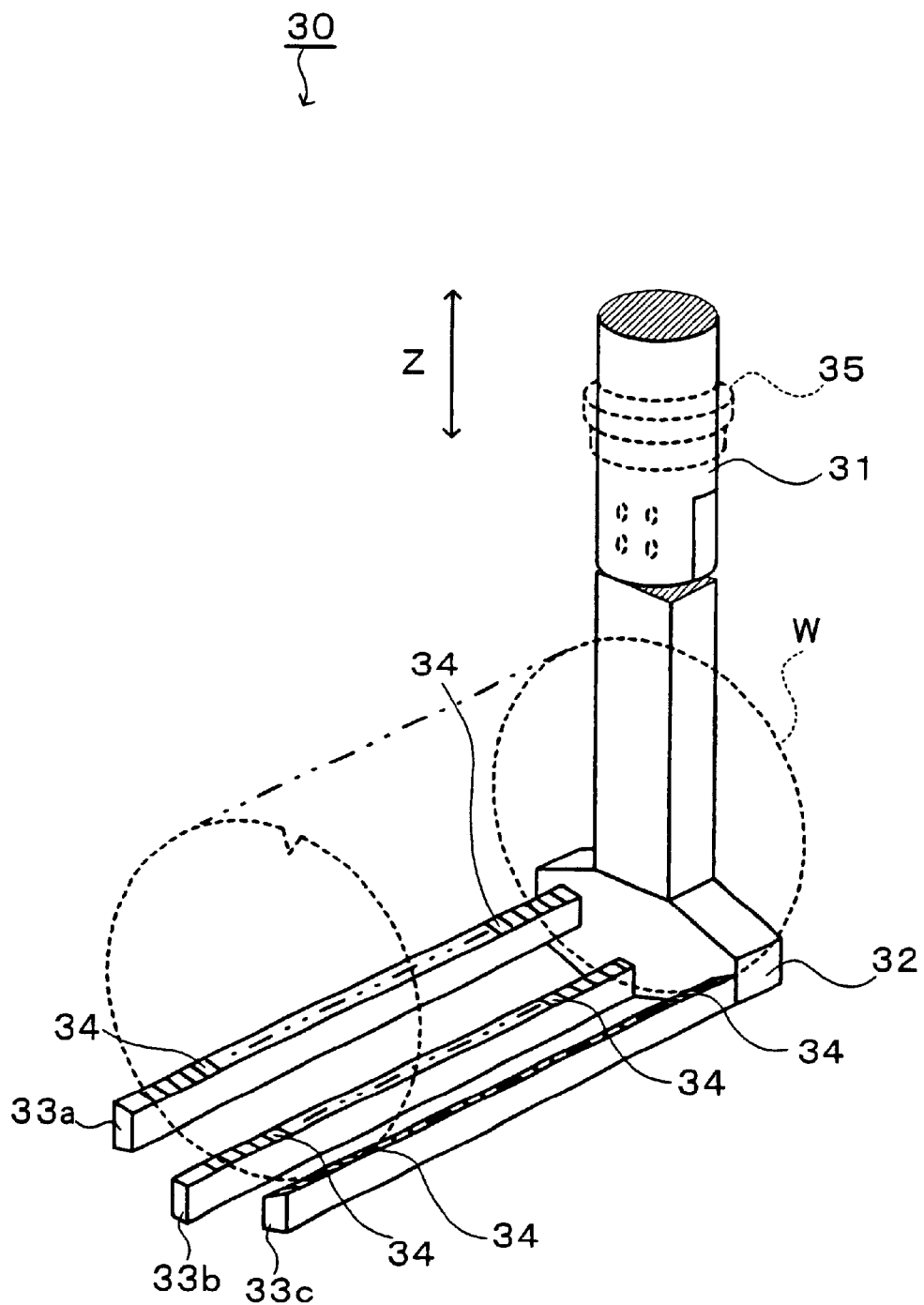
FIG. 4 is a perspective view of a wafer guide.

In the processing vessel 2 there is provided a wafer guide 30 as shown in FIG. 40. The wafer guide 3o is movable up and down (in the Z direction in FIG. 4). The wafer guide 30 comprises a shaft 31, a guide 32, and three parallel holding members 33a, 33b, 33c secured horizontal to the guide 32. Fifty grooves for holding lower peripheral edges of the wafers W are formed at a certain pitch in each holding member 33a, 33b, 33c. Thus, the wafer guide 30 can hold 50 sheets of wafers W vertically and equidistantly. The shaft 31 is passed through the vessel cover 21 and projected beyond the upper side of the processing vessel 2, and an air grip seal 35 is disposed in a gap between the shaft 31 and the vessel cover 21.

Figure 5:
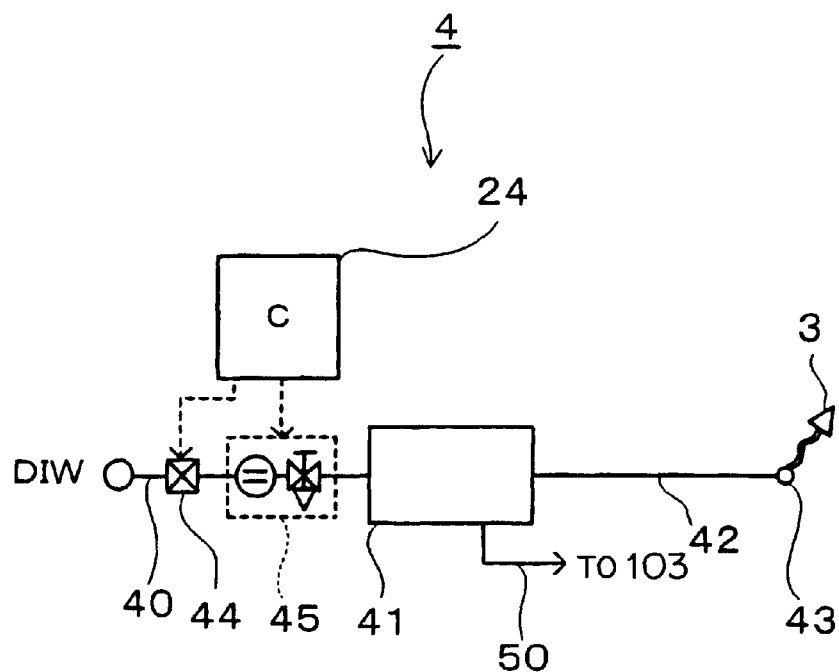
FIG. 5 is a pipe line diagram of steam generating means.

As shown in FIG. 5, steam supply means 4 comprises a pure water supply circuit 40 which feed pure water (DIW), a steam generator 41 which vaporizes pure water fed by the pre water supply means 40 to generate steam 3, steam supply circuit 42 which feed the steam 3 in the steam generator 41, and a steam nozzle 43 which insects the steam 3 into the processing vessel 2.

The pure supply circuit 40 has the inlet side connected to a pure water source (not shown). A change-over valve 44 and a flow rate controller 45 are inserted in the pure water supply circuit 40. The change-over valve 45 and the controller 24 are connected to the controller 24. The controller 24 controls proper feed and a flow rate of the pure water. A heater (not shown) is provided inside the steam generator 41. The pure water fed into the steam generator 41 is vaporized into the steam 3 by the heat of the heater. The steam generator 41 is connected to a drain circuit 50 communicated with a mist trap 103 which will be detailed later. The drain circuit 50 drains to the mist trap 103 that of the pure water which has not been vaporized in the steam generator 41 and drains the steam 3 to the mist trap 103 until a temperature and the steam injection of the steam generator 4 become stable.

Figure 6:
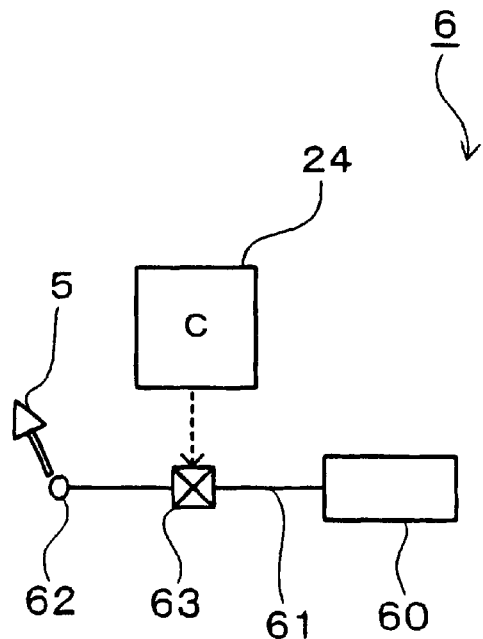
FIG. 6 is a pipe line diagram of ozone gas supply means.

As shown in FIG. 6, the ozone gas supply means 6 comprises an ozonizer 60 which generates ozone gas, an ozone gas supply circuit 61 which feed ozone gas 5 generated by the ozonizer 60, an ozone gas nozzle 62 which injects into the processing vessel 2 the ozone gas 5 fed by the ozone gas supply circuit 61. The ozonizer 60 generates ozone gas 5 of an ozone concentration of, e.g., about 141 $g/m^3$ (normal) [6.6 vol. % (volume percentage)] and flows the ozone gas 5 to the ozone gas supply circuit 61 at an about 40 L/min flow rate. An opening/closure valve 63 is inserted in the ozone gas supply circuit 61. The opening/closure valve 63 is connected to the controller 24. The controller 24 controls proper feed of the ozone gas 5.

Figure 7:
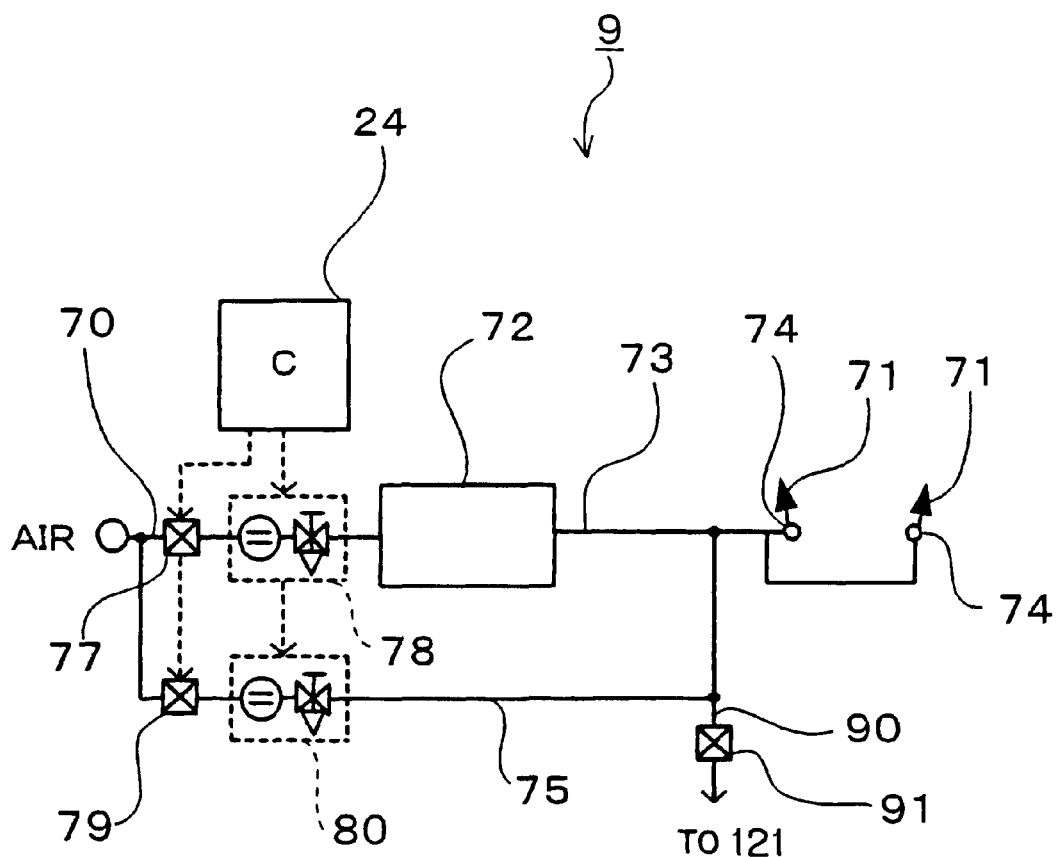
FIG. 7 is a pipe line diagram of air supply means.

As shown in FIG. 7, the air supply means comprises a first air supply circuit 70 which feeds air, a hot air generator 72 which heats the air fed by the first air supply circuit 70 to generate hot air 71, a hot air supply circuit 73 which feed the hot air 71 in the hot air generator 72, air nozzles 74, 74 which inject the hot air 71 fed by the hot air supply circuit 73, and a second air supply circuit 75 which feeds air directly to the air nozzles 74, 74 without passing through the hot air generator 72.

The first air supply circuit 70 has the inlet side connected to an air source (not shown). The air source supplies air of the room temperature at a flow rate of, e.g., 500 L/min. An opening/closure valve 77, a flow rate controller 78 are inserted sequentially in the first air supply circuit 70. A heater (not shown) which heats air is provided inside the hot air generator 72. An opening/closure valve 79 and a flow rate controller 80 are sequentially inserted in the second air supply circuit 75. The opening/closure valves 77, 79 and the flow rate controllers 78, 80 are connected to the controller 24. The second air supply circuit 75 is connected to an air introducing circuit 90 which releases air into an exhaust manifold 121 which will be described later. An opening/closure valve 91 is inserted in the air introducing circuit 90.

Figure 8:
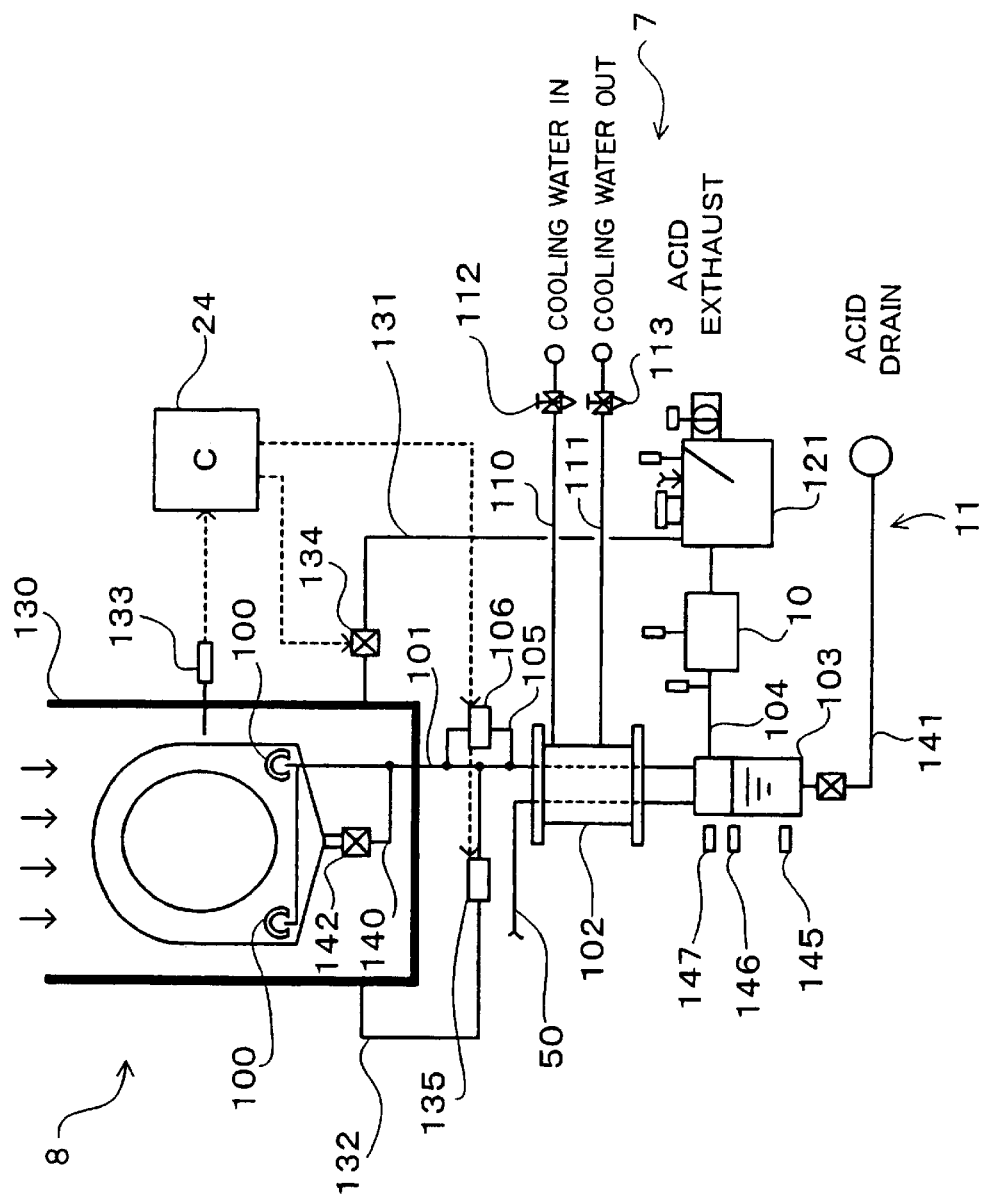
FIG. 8 is a pipe line diagram of interior exhaust pipe line, peripheral exhaust means and drain means.

As shown in FIG. 8, the interior atmosphere exhaust means 7 comprises exhaust units 100, 100 disposed inside the processing vessel 2, a first interior exhaust circuit 101 which exhausts interior atmosphere in the processing vessel 2, a cooling unit 102, the mist trap 103 and a second interior exhaust circuit 104 connected to the upper end of the mist trap 103.

The exhaust units 100, 100 take in interior exhaust of the processing vessel 2. A plurality of fine holes (not shown) are formed in the outer sides of the exhaust units 100, 100. The respective exhaust units 100, 100 are connected to the first interior exhaust circuit 101.

The first interior exhaust circuit 101 includes a bypass circuit 105, and an interior ejector 106 as a forced exhaust mechanism for the interior atmosphere. The bypass circuit 105 passes gas in the first interior exhaust circuit 101 to the interior ejector 106 and sends it back into the first interior exhaust circuit 101.

The interior ejector 106 quickly draws interior atmosphere of the processing vessel 2 to send it under pressure to the mist trap 103 to thereby establish a slight negative pressure atmosphere in the processing vessel and perform forced exhaust. The interior ejector 106 is connected to the controller 24. An operation of the interior ejector 106 is controlled by an operation signal outputted by the controller 24. While the processing is being normally carried out, no operation signal is outputted to the interior ejector 106 so as to place the interior ejector 106 out of operation.

The cooling unit 102 cools and condenses the steam 3 exhausted out of the steam generator 41 and the steam exhausted out of the interior of the processing vessel 2. That is, the drain circuit 50 and the first interior exhaust circuit 101 are passed through the cooling unit 102. The cooling unit 102 is connected to the cooling water supply circuit 110 and the cooling water drain circuit 111 which drains the cooling water. A flow rate adjusting valve 112 is inserted in the cooling water supply circuit 110, and a flow rate adjusting valve 113 is inserted in the cooling water drain circuit 111. It is preferable that while cooling water is being continuously fed from the cooling water supply circuit 110 into the cooling unit 102, waste cooling water is drained by the cooling water drain circuit 111, whereby the cooling unit 102 is incessantly filled with fresh cooling water.

The mist trap 103 exhausts gas and liquid separately. That is, the respective exhaust units 100 exhaust steam and ozone gas in the processing vessel 2 to the mist strap 103 through the first interior exhaust circuit 101. In this case, the steam 3 exhausted out of the interior of the processing vessel 2 is cooled and condensed while flowing through the cooling unit 102, which has been fed with cooling water by the cooling water supply circuit 110. Liquid drops of the steam 3 condensed and liquidized drop in the mist trap 103. On the other hand, the ozone gas is introduced as it is into the mist trap 103. The interior atmosphere exhausted out of the processing vessel 2 is suitably separated into ozone gas 5 and liquid drops, and the mist trap 103 exhausts the ozone gas to the second interior exhaust circuit 104 and the liquid drops to a second waste liquid circuit 141 which will be explained later. The pure water flows as it is through the drain circuit 50 to be dropped into the mist trap 103. The steam 3 is cooled and condensed into liquid drops while flowing through the cooling unit 1102 to be dropped into the mist trap 103.

As shown in FIG. 9, a first concentration sensor 120 as interior concentration detecting means which detects an ozone concentration in the exhaust interior atmosphere, and the ozone killer 10 are inserted sequentially in the second interior exhaust circuit 104. The outlet of the second interior exhaust circuit 104 is connected to the exhaust manifold 121.

The first concentration sensor 120 inserted in the second interior exhaust circuit 104 is positioned upstream of the ozone killer 10. An ozone concentration of the exhaust interior atmosphere is detected before it enters the ozone killer 10 so as to detect an ozone concentration in the processing vessel 2. The first concentration sensor 120 is connected to the controller 24, and detected signals of the first concentration sensor 120 are inputted to the controller 24. The controller 24, which, as described above, outputs an operation signal to the lift mechanism 23, controls the opening and closure of the vessel cover 21, based on an ozone concentration detected by the first concentration sensor 120. In controlling the opening and closure of the vessel cover 21, the vessel cover 21 is not opened, for example, unless an ozone concentration in the processing vessel 2 is below a prescribed value (e.g., 0.1 ppm). This is because if the vessel cover 21 is opened when an ozone concentration is above a prescribed value, an ozone atmosphere of above an allowable value will disperse around, resultantly with a risk of accident involving human bodies.

The ozone killer 10 thermally decomposes ozone by heating into oxygen ($O_2$). A heating temperature of the ozone killer 10 is set to be above, e.g., 400° C. Such heating-type ozone killer 10 has a long lifetime, and. even after a long time of use, can remove ozone from the gas in the second interior exhaust circuit 104 without reducing removing ability. Furthermore, it is preferable that the ozone killer 10 is connected to an uninterruptive power supply (not shown) so that, even in a power failure, electric power is stably supplied from the uninterruptive power supply to the ozone killer 10. Thus, even in a power failure, the ozone killer 10 can be in operation to remove the ozone for safety.

The ozone killer 10 has a temperature sensor 122 as operation detecting means (e.g., operation detector) which detects an operational state of the ozone killer 10. The temperature sensor 122 detects a heating temperature of the ozone killer 10. The temperature sensor 122 is connected to the controller 24. The controller 24 judges based on a heating temperature of the ozone killer 10 detected by the temperature sensor 122 whether or not the ozone killer 10 is sufficiently ready to remove the ozone. For example, when a heating temperature of the ozone killer 10 is below 400° C. excluding 400° C., the controller judges that the ozone killer 10 is not sufficiently ready to decompose the ozone.

The exhaust manifold 121 collectively performs the exhaust of the apparatus as a whole. The exhaust manifold 121 is connected to the second interior exhaust circuit 104, the air introduction circuit 90 and the first peripheral exhaust circuit 131. A plurality of pipes (not shown) for taking in a peripheral atmosphere behind the cleaning equipment 1 are disposed for preventing the ozone gas 5 from dispersing around. Furthermore, the exhaust manifold 121 is communicated with an exhaust system which is exclusive for acid (ACID EXHAUST) in the plant and functions as a junction where various exhaust gases meet before released to the exhaust system exclusive for acid (ACID EXHAUST). The dispersion of the ozone gas 5 is thus prevented for strict exhaust administration.

The exhaust manifold 121 has the second concentration sensor 123 which detects an ozone concentration. The second concentration sensor 123 provided in the exhaust manifold 121 is connected to the controller 24, and detected signals of the second concentration sensor 123 are inputted to the controller 24. Based on the detected signal by the second concentration sensor 122, the controller 24 monitors ozone removing abilities of the ozone killer 10 to check leakage of the ozone gas 5 due to malfunctions of, e.g., the ozone killer 10.

A shown in FIG. 8, the peripheral exhaust means 8 comprises a case 130 enclosing the processing vessel 2, the first peripheral exhaust circuit 131 having one end connected to the bottom of the case 130 and the other end connected to the exhaust manifold 121 as described above, and the second peripheral exhaust circuit 132 having one end connected to the bottom of the case 130 and the other end connected to the interior exhaust circuit 101.

Fresh air is supplied from above in down flows into the case 130. The down flows prevent the interior atmosphere in the case 130, i.e., the peripheral atmosphere in the processing vessel 2 from leaking outside, and also pushes downward the interior atmosphere in the case 130 so that the interior atmosphere can easily flow into the first peripheral exhaust circuit 131 and the second peripheral exhaust circuit 132. The case 130 includes the third concentration sensor 133a as a peripheral concentration sensor of ozone concentrations in the peripheral atmosphere of the processing vessel 2. The third concentration sensor 133 is connected to the controller 24, and detected signals of the third concentration sensor 133 are inputted to the controller 24. Based on an ozone concentration detected by the third concentration sensor 133, the controller 24 detects leakage of the ozone gas 5.

The first peripheral exhaust circuit 131 includes an opening/closure valve 134. The opening/closure valve 134 is connected to the controller 24. The controller 24 opens the opening/closure valve 134 while the processing is in normal operation. Meanwhile, the first peripheral exhaust circuit 131 exhausts the peripheral atmosphere of the processing vessel 2 to the exhaust manifold 121.

The second peripheral exhaust circuit 132 includes a peripheral ejector 135. The peripheral ejector 135 quickly draws and sends under pressure the peripheral atmosphere of the processing vessel 2 to the mist trap 103 so as to perform forced exhaust. The peripheral ejector 135 is connected to the controller 24. The operation of the peripheral ejector 135 is controlled by operation signals outputted by the controller 24. The controller outputs no operation signal to the peripheral ejector 135 while the processing is normally performed, so as to keep the operation of the peripheral ejector 135 paused.

Here, because ozone is a harmful substance to the human body, the cleaning equipment 1 has various safety measures. That is, as described above, the controller 24 is connected to the weight sensor 27 (shown in FIG. 2) and the temperature sensor (shown in FIG. 9). The opening/closure valve 63 (shown in FIG. 6) of the ozone supply means is connected to the controller 24. Based on a detected signal inputted by the weight sensor 27 and a detected signal inputted by the temperature sensor 122, the controller 24 controls the opening and closure of the opening/closure valve 63 of the ozone gas supply means 6. The controller 24 opens the opening/closure valve 63 when the controller 24 has confirmed that the vessel cover 21 is tightly closed, and a heating temperature of the ozone killer 10 is above 400° C. Thus, the ozone supply means 6 can feed ozone, and the processing can be started. On the other hand, when the vessel cover 21 is opened, or a heating temperature of the ozone killer 10 is below 400° C. excluding 400° C., the controller 24 closes the opening/closure valve 62, because there are risks that ozone may be dispersed and that ozone may be exhausted, not sufficiently decomposed in oxygen. Thus, the ozone gas supply means 6 cannot feed ozone gas 5. The processing is not started until either of these two conditions is prepared.

The interior ejector 106 performs forced exhaust when the cleaning equipment 1 is instantaneously paused due to accidents such as power failures, earthquakes, etc., and the processing is interrupted. That is, the interior ejector 106 is connected to the controller 24 as described above. For example, when an accident takes place, the controller immediately outputs an operation signal to the interior ejector 106. Based on the operation signal, the interior atmosphere exhaust means 7 performs forced exhaust to exhaust ozone remaining the processing vessel 2. When the cleaning equipment 1 is reactuated after an instantaneous pause, operators in the plant often open the vessel cover 21 to once confirm or check an interior state of the processing vessel, such forced exhaust can prevent accidents which may occur when the processing vessel 2 is thus opened. It is preferable that the interior ejector 106 and the controller 24 are connected to the uninterruptive power supply, as is the ozone killer 10, so that the forced exhaust can be performed during a power failure.

As described above with reference to FIG. 8, the third concentration sensor 133 is connected to the controller 24. Based on a detected signal of the third concentration sensor 133, the controller 24 controls the forced exhaust of the interior ejector 106 and the feed of the ozone gas 5 by the ozone gas supply means 6. That is, when the controller 24 detects leakage of the ozone gas 5, based on a detected signal inputted by he third concentration sensor 133, the controller 14 immediately outputs an operation signal to the interior ejector 106 while closing the opening/closure valve 63 of the ozone gas supply means 6. Thus, the interior ejector 106 is operated so as to forcedly exhaust the interior atmosphere in the processing vessel 2 at a higher exhaust rate than normal while the feed of the ozone gas 5 is stopped, whereby more ozone gas 5 is prevented from leaking out of the processing vessel. The peripheral ejector 135 is also connected to the controller 24. Based on a detected signal of the third concentration sensor 133, the controller 24 controls the forced exhaust of the peripheral ejector 135. That is, the controller 24 output an operation signal to the peripheral ejector 135 while closing the opening/closure valve 134 of the first peripheral exhaust circuit 131. Thus, the peripheral ejector 135 is actuated to forcedly exhaust the peripheral atmosphere of the processing vessel 2 at a higher exhaust rate than normal through the second peripheral exhaust circuit 132 so as to prevent the leaked gas from dispersing around. The exhausted peripheral atmosphere flows through the second peripheral exhaust circuit 132 to the first interior exhaust circuit 101 and to the mist trap 103 to be exhausted to the second interior exhaust circuit 104. In the second interior exhaust circuit 104, the ozone is removed by the ozone killer 10, and the peripheral atmosphere which has been made harmless is exhausted for safety to the exhaust system exclusive for acid (ACID EXHAUST) of the plant. When the leaked gas can be prevented from dispersing around at a normal exhaust rate owing to, e.g., a volume of the case 130, the down flows from above, etc., it is possible that the normal exhaust is performed with the feed of the ozone gas 5 stopped.

As described above with reference to FIG. 7, the flow rate controller 80 of the second air supply circuit 75 is connected to the controller 24. The controller 24 controls the feed of air by the air supply means 9 when the interior atmosphere in the processing vessel 9 is exhausted after the feed of the ozone gas 5 is stopped. That is, upon the exhaust, the controller 24 closes the opening/closure valve 77 while opening the opening/closure valve 79, and restricts the flow rate controller 80 so that an air feed amount is smaller than an exhaust amount of the interior atmosphere. Accordingly, even when air of the room temperature is fed into the processing vessel 2 during the exhaust, a negative atmospheric pressure is established in the processing vessel 2. When a large amount of the room temperature air is fed into the processing vessel 1 during the exhaust, and a positive atmospheric pressure is established in the processing vessel 2, there is a risk that the ozone gas 5 may leak around. The air feed amount is thus adjusted to establish a negative atmospheric pressure in the processing vessel 2, whereby the leakage of the ozone gas 5 is prevented while the ozone gas 5 can be forced out of the processing vessel 2.

As shown in FIGS. 8 and 10, the drain means 11 comprises the first drain circuit 140 connected to the bottom of the processing vessel 2, and the second drain circuit 141 connected to the bottom of the mist trap 103. An opening/closure valve 142 is inserted in the first drain circuit 140. The first drain circuit 140 is connected to the first interior exhaust circuit 101 to flow liquid drops in the processing vessel 2 to the interior exhaust circuit 101. An opening/closure valve 143 is inserted in the second drain circuit 141. The second drain circuit 141 is communicated with a drain circuit exclusive for acid (ACID DRAIN) in the plant. The drain means 11 comprises an emptiness prevention sensor 145, a drain start sensor 146 and a liquid over sensor 147 which are disposed upward in the stated order. The controller 24 is connected to the opening/closure valve 143, the emptiness prevention 145, the drain start sensor 146 and the liquid over sensor 147.

In this case, the liquid drops in the processing vessel 2, the pure water drained out of the steam generator 41 and the liquid drops liquidized from the steam 3 are introduced into the mist strap 103. When some liquid drops are collected in the mist trap 103, and a liquid surface reaches the drain start sensor 146, the drain start sensor 146 inputs an arrival signal to the controller 24. The controller 24 opens the opening/closure valve 143 to start the drain. When a level of the liquid surface goes even up to the liquid over sensor 147, the liquid over sensor 147 inputs an alarm signal tot he controller 24. When a level of the liquid surface is below the emptiness prevention sensor 145, the emptiness prevention sensor 145 inputs a prohibition signal to the controller 24. The controller 24 closes the opening/closure valve 143. The emptiness prevention sensor 145 prevents all liquid drops from flowing out of the mist trap 103 to thereby make the mist trap 103 empty, letting out the ozone gas 5 into the drain circuit exclusive for acid (ACID DRAIN) in the plant.

Figure 11:
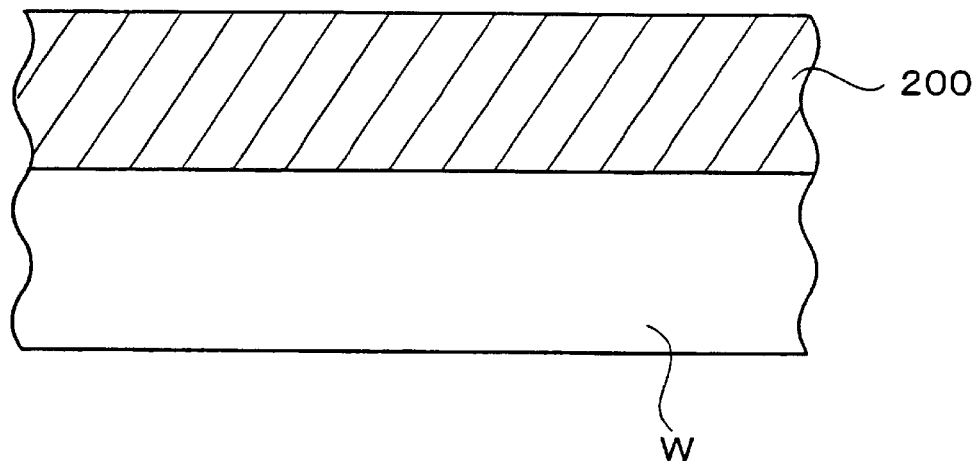
FIG. 11 is an explanatory view of the first step of processing made in the cleaning equipment shown in FIG. 1.
Figure 12:
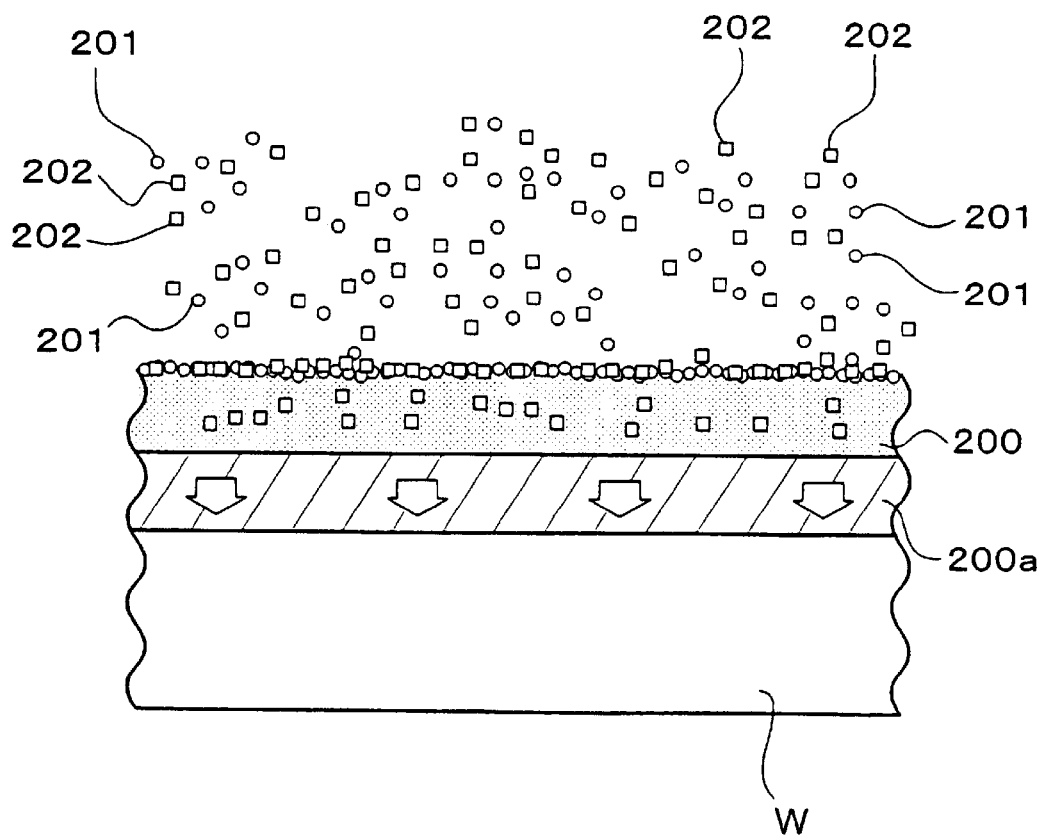
FIG. 12 is an explanatory view of the second step of processing made by the cleaning equipment shown in FIG. 1.

Next, the cleaning method according to one embodiment of the present invention, which uses the cleaning equipment 1 having the above-described constitution will be explained with reference to a first and a second step explanatory views showing in FIGS. 11 and 12, and the flow chart shown in FIG. 13.

First, the vessel cover 21 is lifted to open the processing vessel. Fifty sheets of wafers W each with a resist film 200 formed on as shown in FIG. 11 are conveyed to the cleaning equipment 1 by conveyance means (not shown) and loaded into the vessel body 20. Then, the vessel cover 21 is lowered to tightly close the vessel body 2 (processing started). Then, the processing vessel 2 is heated by the rubber heaters 28a–28c while hot air 71 is fed into the processing vessel 2 by the air supply means 9 to thereby heat the wafers W and an interior atmosphere in the processing vessel 2 up to a prescribed temperature (e.g., 80–120° C.).

Figure 13:
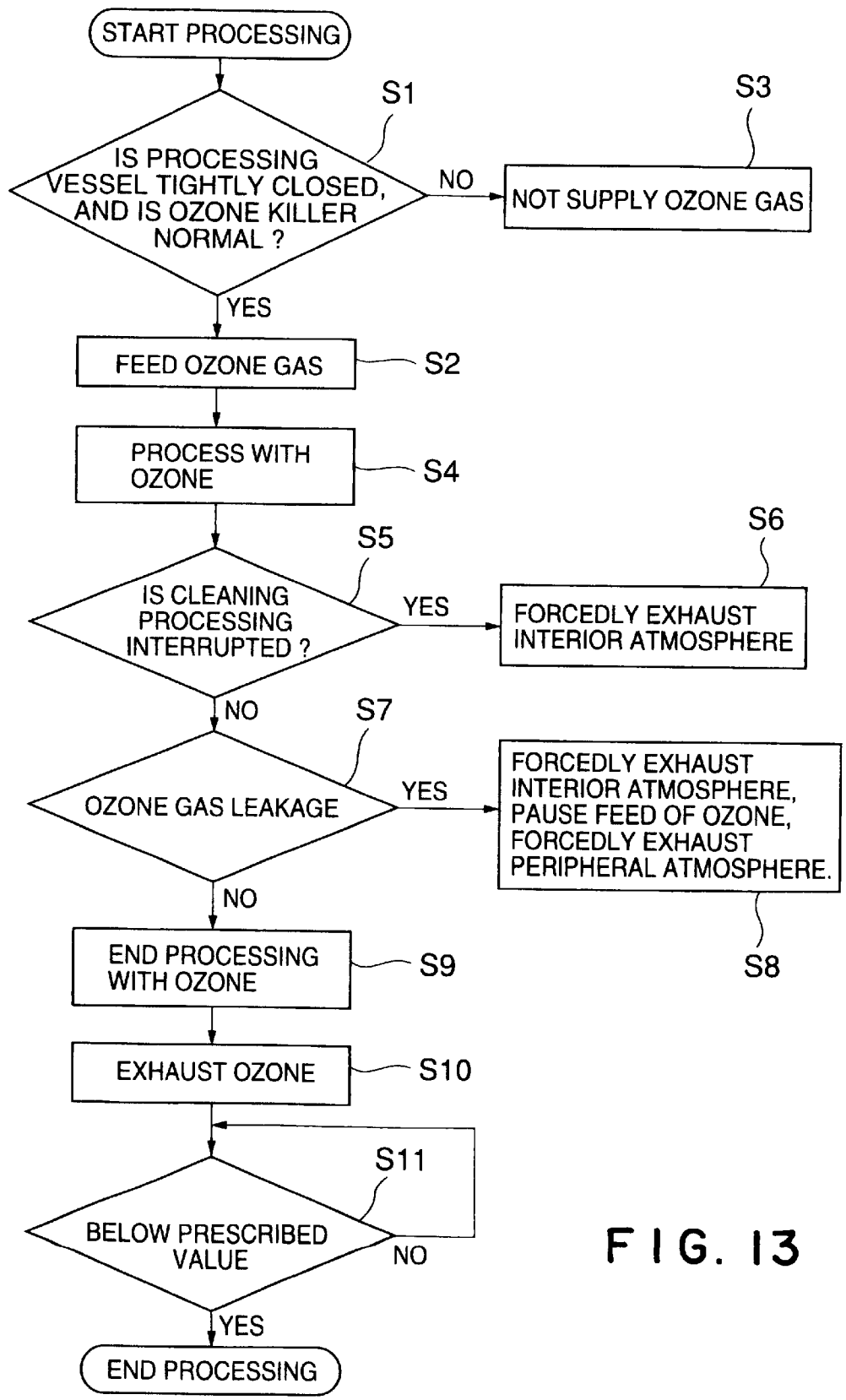
FIG. 13 is a flow chart of processing made by the cleaning equipment shown in FIG. 1.

In the step S1 in FIG. 13, the controller 24 confirm based on a detected signal of the weight sensor 27 and a detected signal of the temperature sensor 122 whether or not the processing vessel 2 is tightly closed, and the ozone killer 10 has a heating temperature of above 400° C. and is in a state for sufficiently removing ozone. When the controller 24 judges that these two conditions are satisfied, the controller 24 opens the opening/closure valve 63 of the ozone gas supply means 6. Then, the ozone supply means 6 feeds ozone gas 5 into the processing vessel 2 (S2 in FIG. 13). When neither of the two conditions are satisfied, the controller 24 closes the opening/closure valve 63 so that no ozone gas is fed (S3 in FIG. 13). Steam is fed into the processing vessel 2 by the steam supply means 4.

By using the steam 3 and the ozone gas 5, the wafers F are processed by the ozone (S4 in FIG. 13). As shown in FIG. 12, a mixed layer in which water molecules 201 and ozone molecules 202 are mixed is formed on the surface of each wafer W. In the mixed layer, the water molecules 201 and the ozone molecules 202 react with each other to generate on the surface of the wafer W large amounts of reaction substances, such as oxygen (O) radicals, hydroxyl (OH) radicals, etc. The hydroxy radicals generated on the surface of the wafer W do not distinguish but immediately causes oxidation to decompose the resist into carbonic acid, carbon dioxide, water, etc. As shown in FIG. 12, the hydroxy radicals sufficiently oxidation-decompose the resist film 200 to decompose the resist film 200 to a water-soluble film 200a. The water-soluble film 200a can be easily removed by later rinse with pure water.

During the processing, in the interior atmosphere exhaust means 7, an interior atmosphere in the processing vessel 2 is taken in through the exhaust units 100, 100 and is flowed to the ozone killer 10 sequentially through the first interior exhaust circuit 101, the mist strap 103 and the second interior exhaust circuit 104 to have ozone removed there to be exhausted to the drain system exclusive for acid (ACID EXHAUST) in the plant. On the other hand, in the peripheral exhaust means 8, a peripheral atmosphere of the processing vessel 2 is taken in by the case 130 and introduced into the exhaust manifold 121 by the first peripheral exhaust circuit 131 to be exhausted to the drain system exclusive for acid (ACID DRAIN) in the plant. Thus, the processing with ozone is made by feeding the steam 3 and the ozone gas 5 to the wafers W loaded in the tightly-closed processing vessel 2 while the interior atmosphere in the processing vessel 2 is drawn out, and passed through the ozone killer 10 to be made harmless.

Here, in the step S5 in FIG. 13, when the cleaning equipment 1 is instantaneously paused due to a power failure or an earthquake or others, and the processing with ozone is interrupted, the interior atmosphere in the processing vessel 2 is forcedly exhausted by the interior ejector 106 of the interior atmosphere exhaust means 7 (S6 in FIG. 13). In the step S7 in FIG. 13, when the controller 4 recognizes leakage of the ozone 5 in the peripheral atmosphere of the processing vessel, based on a detected signal of the third concentration sensor 133, the controller 24 outputs an operation signal to the interior ejector 106 and closes the opening/closure valve 63 of the ozone gas supply means 6. The controller 24 also forcedly exhausts the interior atmosphere in the processing vessel and stops the supply of the ozone gas 5. The controller 24 also outputs an operation signal to the peripheral ejector 135 and closes the opening/closure valve 134 of the first peripheral exhaust circuit 101 to thereby forcedly exhaust the peripheral atmosphere of the processing vessel 2 through the second peripheral exhaust circuit 132 (S8 in FIG. 13)

The processing with ozone is completed, and the feed of the steam 3 and the ozone gas 5 is stopped (S9 in FIG. 13). The interior atmosphere in the processing vessel 2 is kept on being exhausted, air of the room temperature is fed to t air supply means to force out the ozone (S10 in FIG. 13). Here, the controller 24 restricts a flow rate of the flow rate controller 80 of the second air supply circuit 75 to make a flow rate of the air supply lower than an exhaust rate of the interior atmosphere.

In the step S11 in FIG. 13, the controller 24 detects an ozone concentration in the processing vessel 2 by the first concentration sensor 120 to confirm whether or not a value of the ozone concentration is below a prescribed value (e.g., 0.1 ppm) which is harmless to the human body. When the controller 24 confirms that the value of the ozone concentration is below the prescribed value, the controller 24 lift the processing cover 21 to open the processing vessel 2. Then, the wafers W are unloaded (the processing is completed). When the controller 24 judges that the value of the ozone concentration is above the prescribed value, the controller 24 sets on the exhaust of the ozone. The processing vessel 2 is thus opened after the safety has been confirmed, whereby accidents can be prevented.

The unloaded wafers W are conveyed by the conveyance means to a rinse equipment to be rinsed with pure water. The resist film 200, which has been decomposed to be water-soluble as described above, can be easily removed from the wafers W. Finally, the wafers W are conveyed from the rinse equipment to a drying equipment to be dried there.

In such cleaning equipment, when ozone is fed before the processing vessel 2 is tightly closed, the ozone gas 5 disperses around. Furthermore, unless ozone can be removed from the exhausted atmosphere, there is a risk that the ozone gas 5 may leak as it is to the exhaust system exclusive for acid (ACID EXHAUST) in the plant. However, the cleaning equipment 1 according to the present invention supplies ozone gas 5 into the processing vessel 2 under the conditions that the processing vessel 2 is tightly closed, and that the removal of ozone from the exhausted interior atmosphere can be normally performed, whereby the dispersion and untreated exhaust of the ozone gas 5 can be prevented. Accordingly, accidents to human bodies due to ozone can be prevented in advance.

When the processing is interrupted by a power failure, an earthquake or others, the interior atmosphere in the processing vessel 2 is forcedly exhausted to force ozone out of the processing vessel 2. Here, when the interrupted processing using ozone is resumed, operators of the plant, for example, often open the processing vessel 2 to confirm or inspect a state inside. If the processing vessel 2 with ozone remaining therein is opened, the ozone will disperse. However, the interior atmosphere is forcedly exhausted, whereby the dispersion of the ozone can be prevented, and accordingly, accidents to the human body can be prevented for safety.

If the ozone gas 5 should leak through, e.g., a gap in the processing vessel 2 in processing using ozone, the interior atmosphere is forcedly exhausted immediately at the time of the gas leakage, and the feed of the ozone gas 5 is stopped, whereby no more gas can leak, which minimizes damage. The peripheral atmosphere of the processing vessel 2 is forcedly exhausted, whereby the ozone gas 5 is prevented from dispersing outer of the periphery of the processing vessel 2. Accordingly, even if the ozone gas 5 should leak, safely no accident will take place. It is preferable that, e.g., after the forced exhaust, operators of the plant maintain the cleaning equipment to repair a gap in the processing vessel 2, so that no gas leakage will take place in the following processing.

Air of the room temperature is being fed while ozone is being exhausted, whereby the ozone gas 5 can be forced out of the processing vessel 2. Furthermore, because an air flow rate is lower than an exhaust rate of the interior atmosphere, the interior of the processing vessel 2 can have a negative atmosphere. Accordingly, the ozone gas 5 can be prevented from leaking, and the exhaust can be quick.

Figure 14:
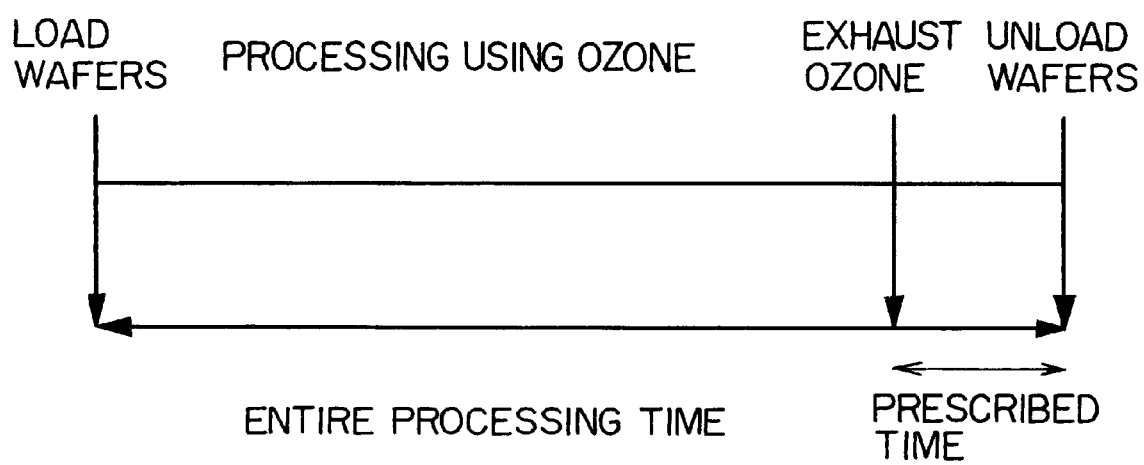
FIG. 14 is a view explaining a flow of exhausting an interior atmosphere in the processing vessel for a prescribe period of time after processing using ozone is completed.

One embodiment of the present invention has been described above, but the present invention is not limited to the above-described embodiment. In the above-described embodiment, a timing of opening the vessel cover 21 is based on the detection of the first concentration sensor 120. However, a timing of opening the vessel cover 21 may be based on an exhausting time. That is, as shown in FIG. 14, in a total processing time of the cleaning equipment 1, processing using ozone is made following the load of wafers W, and then the exhaust of the ozone is performed for a prescribed period of time, and the wafers W are unloaded. The prescribed period of time is set to be a period of time necessary to make an ozone concentration in the processing vessel 2 lower than a prescribed value. The safety can be thus ensured so as to prevent accidents.

In the above-described embodiment, the resist film 200 is removed by using ozone gas 5. However, it is possible that various attachments to wafers W may be removed by using other processing gases. For example, chlorine ($Cl_2$) gas and steam are fed to remove metal attachments and particles from the surfaces of wafers W. It is also possible that hydrogen ($H_2$) gas and steam are fed to remove metal attachments and particles from the surfaces of wafers W. It is also possible that fluorine ($F_2$) gas and steam are fed to remove natural oxide films and particles from the surfaces of wafers W. In these cases, corresponding to respective states, various post-treatment mechanisms are provided in the second interior exhaust circuit 104. It is also possible that ozone gas containing oxygen radicals, chlorine gas containing chlorine radicals, hydrogen gas containing hydrogen radicals and fluorine gas containing fluorine radicals are fed to make various processing.

The present invention is applicable not only to batch processing which processes a plurality of substrates at once, but also sheet processing which process one sheet. The substrate is not limited to the above-described wafers W, but also LCD substrate, CD substrates, print substrates, ceramic plates, etc.

According to a first substrate processing method of the present invention, dispersion and untreated exhaust of a processing gas can be prevented. Especially, in a case that a processing gas is ozone gas, which is harmful to the human body, accidents to the human body due to the harmful substance can be precluded. According to a second substrate processing method of the present invention, occurrence of accidents can be prevented when the cleaning equipment is reactuated after a pause due to, e.g., an accidental failure. According to a third substrate processing method of the present invention, even if a processing gas should leak, safely the damage could be minimized without occurrence of accidents.

According to a fourth to a sixth substrate processing method of the present invention, the same function and effect as those of the third substrate processing method according to the present invention. According to a fifth substrate processing method of the present invention, the peripheral atmosphere is made harmless to be exhausted for safety to, e.g., an exhaust system of a plant. According to a sixth substrate processing method of the present invention, a processing gas is prevented without failure from dispersing beyond the periphery of the processing vessel.

According to a seventh and an eighth substrate processing method of the present invention, the processing vessel is opened after safety has been confirmed, whereby accidents can be prevented. According to a ninth substrate processing method of the present invention, when a processing gas is exhausted, leakage of the processing gas can be prevented.

According to a first substrate processing system of the present invention, the first substrate processing method of the present invention can be suitably carried out. According to a second substrate processing system of the present invention, the second substrate processing method of the present invention can be suitably carried out. According to a third substrate processing system of the present invention, the third substrate processing method of the present invention can be suitably carried out. According to a fourth substrate processing system of the present invention, the sixth substrate processing method of the present invention can be suitably carried out.

According to a fifth substrate processing system of the present invention, the fourth substrate processing method of the present invention can be suitably carried out. According to a sixth substrate processing system of the present invention, the sixth substrate processing method can be suitably carried out.

According to a seventh substrate processing system of the present invention, the seventh substrate processing method of the present invention can be suitably carried out. According to an eighth substrate processing system of the present invention, when a processing gas is exhausted, a negative pressure atmosphere is established in the processing vessel, whereby leakage of a processing gas can be prevented and can be quickly exhausted.

What is claimed is:

1. A substrate processing apparatus in which a processing gas is fed with a processing gas supply nozzle to a substrate loaded in a processing vessel while an interior atmosphere of the processing vessel is being exhausted through an interior exhaust pipe line to be post-treated by a post-treatment mechanism, the apparatus comprising:
    a vessel cover for covering an opening of the processing vessel; and
    controller for controlling feed of the processing gas by the processing gas supply nozzle, based on a detected signal outputted by a detector for detecting opening or closing of the vessel cover, and a detected signal outputted by operation detector for detecting an operational state of the post-treatment-mechanism.

2. A substrate processing apparatus according to claim 1, wherein the interior atmosphere exhaust pipe line comprises an ejector for forcedly exhausting the interior atmosphere of the processing vessel.

3. A substrate processing apparatus according to claim 2, comprising a peripheral concentration sensor for detecting a processing gas concentration in a peripheral atmosphere of the processing vessel; a second ejector for forcedly exhausting the peripheral atmosphere of the processing vessel; and controller for controlling, based on a detected signal outputted by the peripheral concentration sensor, the forced exhaust by the ejector for forcedly exhausting the interior atmosphere of the processing vessel and the feed of the processing gas by the processing gas supply nozzle.

4. A substrate processing apparatus according to claim 3, comprising controller for controlling the forced exhaust of the peripheral atmosphere by the second ejector, based on a detected signal outputted by the peripheral concentration sensor.

5. A substrate processing apparatus according to claim 3, wherein when the concentration sensor has an abnormality, the controller pauses the feed of the processing gas while controlling the ejector to operate.

6. A substrate processing apparatus according to claim 1, comprising interior concentration sensor for detecting a processing gas concentration in the processing vessel; and controller for controlling the opening or closing of the the vessel cover, based on a detected signal outputted by the interior concentration sensor.

7. A substrate processing apparatus according to claim 1, comprising an air supply nozzle for feed air in the processing vessel.

8. A substrate processing apparatus in which a processing gas is fed with a processing gas supply nozzle to a substrate loaded in a processing vessel while an interior atmosphere of the processing vessel is being exhausted through an interior atmosphere exhaust pipe line to be post-treated by a post-treatment mechanism, the apparatus comprising:
    a vessel cover for covering an opening of the processing vessel;
    a peripheral concentration sensor for detecting a processing gas concentration in the peripheral atmosphere of the processing vessel;
    a peripheral exhaust pipe line connected to a case for exhausting the peripheral atmosphere of the processing vessel; and
    controller for controlling, based on a detected signal outputted by the peripheral concentration sensor, the exhaust through the interior atmosphere exhaust pipe line and the feed of the processing gas by the processing gas supply nozzle.

9. A substrate processing apparatus according to claim 8, comprising controller for controlling the exhaust by the peripheral exhaust pipe line and the case, based on a detected signal outputted by the peripheral concentration sensor.

* * * * *